United States Patent

Kawai

Patent Number: 6,072,997
Date of Patent: Jun. 6, 2000

[54] FREQUENCY DISCRIMINATOR FOR A DIRECT CONVERSION RECEIVER

[75] Inventor: Kazuo Kawai, Tokyo, Japan

[73] Assignee: General Research of Electronics, Inc., Tokyo, Japan

[21] Appl. No.: 08/890,851

[22] Filed: Jul. 10, 1997

[30] Foreign Application Priority Data

Apr. 18, 1997 [JP] Japan .................................. 9-116364

[51] Int. Cl.[7] .............................. H03K 9/00; H04L 27/06; H04B 1/16
[52] U.S. Cl. ....................... 455/214; 455/324; 455/263; 455/336; 375/316; 375/344; 375/326
[58] Field of Search ...................................... 455/324, 336, 455/337, 312, 293, 263, 214; 375/344, 316, 326, 327, 339

[56] References Cited

U.S. PATENT DOCUMENTS

| 4,090,145 | 5/1978 | Webb ........................................... 329/1 |
| 5,579,345 | 11/1996 | Kroeger et al. .......................... 375/344 |
| 5,675,498 | 10/1997 | White ...................................... 364/487 |
| 5,832,043 | 11/1998 | Eory ........................................ 375/344 |
| 5,857,004 | 1/1999 | Abe ......................................... 375/344 |

Primary Examiner—Wellington Chin
Assistant Examiner—Sheila B. Smith
Attorney, Agent, or Firm—Trexler, Bushnell, Giangiorgi & Blackstone, Ltd.

[57] ABSTRACT

In a frequency discriminator for a direct conversion receiver having a simple construction, in which operations for FM demodulation by direct conversion are simplified, two-signal components I and Q, which are inphase and quadrature, respectively, in a base band, obtained by direct conversion of an FM signal by means of a local oscillator, a 90° phase shifter, multipliers, LPF and AMP are amplified to a predetermined amplitude and thereafter converted into digital signals by means of A/D converters. These digital signals are given to differentiators to obtain differentials (finite differences) thereof. These values are squared by means of squarers and squares thus obtained are added by means of an adder. An output of the adder is applied to a device for extracting square root to obtain a demodulation output of the FM signal. An ROM may be used in lieu of the squares and the device for extracting square root.

1 Claim, 2 Drawing Sheets

FREQUENCY DISCRIMINATOR FOR A DIRECT CONVERSION RECEIVER

FIELD OF THE INVENTION

The present invention relates to an improvement in a circuit construction of a frequency discriminator for an FM (frequency modulation) signal receiver by direct conversion.

DESCRIPTION OF THE PRIOR ART

There are known two methods in prior art frequency discrimination techniques for demodulating FM signals, whose frequency is reduced to a base band, by direct conversion.

By one of them, after having amplified respective signal components X and Y (called also two-axis components) in the two channels, which are I (Inphase) and Q (Quadrature) of the FM signals, whose frequency is reduced to the base band, to a required amplitude, they are multiplied by I and Q local oscillation carriers having suitable frequencies, respectively, and the FM signals are converted into IF (Intermediate Frequency) signals by adding product outputs thus obtained. The IF signals are demodulated by means of prior art various kinds of analogue type frequency discriminators.

This method can make efficient use of a feature of the direct conversion that there is no image disturbance and in addition it has a merit that prior art various kinds of analogue type frequency discriminators can be utilized therefor. However, on the other hand, it has a disadvantage that an extra circuit is required, because signals, whose frequency is reduced on purpose to the base band, should be inversely converted to the IF band.

The other of them is a well-known method, wherein a demodulated output is obtained directly from the base band signal components X and Y. By this method, designating differentiated signals of X and Y by X' and Y', respectively, and the demodulated output by D, an operation $$D=(XY'-X'Y)/(X^2+Y^2) \qquad (1)$$

is carried out. (This Equation (1) can be deduced from the fact that the frequency is a differentiation of the phase in time and that the phase can be represented by $\tan^{-1}(Y/X)$.)

By this method the operation of the denominator, can be omitted, if the amplitude of the base band signal components is previously fixed to a constant value, and the operation of the numerator can be carried out by means of differentiators, multipliers and an adder. However this method has a problem that the operation requires much time, because basically results of the multipliers should be added a number of times.

Recently CPU (Central Processing Unit) having fairly high working speeds can be easily utilized. However, for another reason, e.g. in case where no high speed adders can be used for a purpose of lowing cost and the operation time is a question, a following method is used. This is such a method that an ROM (Read Only Memory), which outputs $N^2$ when N is inputted as an address, is prepared and product outputs of XY' and X'Y are obtained by using a relation $$\{(A+B)^2-A^2-B^2\}/2=AB \qquad (2)$$

or $$\{(A+B)^2-(A-B)^2\}/4=AB \qquad (3)$$

Since 2 and 4 in the denominators of Equations (2) and (3) are gain coefficients, operations for obtaining them can be omitted just as described previously.

Consequently, by this method demodulation is possible by calculation operations such as operations for obtaining differentials X' and Y', operations for obtaining product outputs obtained by addition and subtraction of outputs of the ROM (squares) by using the above equations, and subtractions between product outputs. That is, the demodulation output D can be obtained by using Equation (4) by substituting X, Y, X' and Y' for A and B in Equation (3) to obtain the relevant squares thereof as outputs of the ROM.

$$D=(X+Y')^2-(X-Y')^2-(X'+Y)^2+(X'+Y)^2 \qquad (4)$$

In Equation (4), in case where base band signal components are in a wide frequency band, since no necessary accuracy can be obtained, if the differentials X' and Y' are obtained by means of analogue differentiators, it is presumed that the differentials X' and Y' are obtained by digital operations. X and Y are sampled simultaneously. Sampled values be $\ldots X_{K-1}, X_K, X_{K+1}, \ldots$ and $\ldots Y_{K-1}, Y_K, Y_{K+1}, \ldots$ Then, for the differentials X' and Y', it is sufficient to calculate finite differences between sampled values. Neglecting the gain coefficient as the differentiator, digital operation means for obtaining the differentials are finite difference calculators and the demodulation output D can be represented by Equation (5).

$$D=(X_K+Y_{K+1}-Y_{K-1})^2-(X_K-Y_{K+1}+Y_{K-1})^2-(X_{K+1}-X_{K-1}+Y_K)^2+(X_{K+1}-X_{K-1}-Y_K)^2 \qquad (5)$$

Therefore the demodulation output can be obtained by calculating squares of four terms (each of which consists of a sum and a difference of three sampled values) and further a sum and a difference thereof, including differentiation operations, as indicated by Equation (5).

In case where finite difference calculations are effected by digital processing, because no necessary accuracy can be obtained by using analogue differentiators for obtaining differentials, as described above, it is advantageous from the point of view of cost to make use of an ROM, in which squares $N^2$ are written, because much time is required for calculation by means of a multiplier. However, when this ROM is used, calculations for obtaining squares of addition and subtraction results of three kinds of signals should be effected four times in total, including finite difference operations, and further these four squares should be added and subtracted to obtain the demodulation output.

As described above, by the prior art method, calculation operation for obtaining squares by means of an ROM and calculation operation after having obtained the squares are troublesome and circuit construction is also complicated.

SUMMARY OF THE INVENTION

An object of the present invention is, therefore, is to provide a frequency discriminator for a direct conversion receiver having a new circuit construction capable of demodulating FM signals by an extremely simple construction, so that the above described calculation operation is improved.

Another object of the present invention is particularly to simplify calculation operations before and after utilization of an ROM in operations after the differential (finite difference) operation, which is a premise of the present invention.

In order to achieve the above objects, a frequency discriminator for a direct conversion receiver according to claim 1 is characterized in that it comprises direct conversion means for converting an FM signal into an inphase signal component and a quadrature signal component in a base band; analogue/digital converting means for converting both the components into digital signals; differentiating means for obtaining differentials of the digital signals; and operating means for obtaining squares of the differentials to obtain a demodulated output of the FM signal by obtaining a sum of the squares and by obtaining a square root of the sum.

Another invention is characterized in that, in the invention according to claim 1, the operating means consists of an ROM and an adder and squares and square roots are stored in the ROM.

DESCRIPTION OF THE PREFERRED EMBODIMENTS

Figure 1:
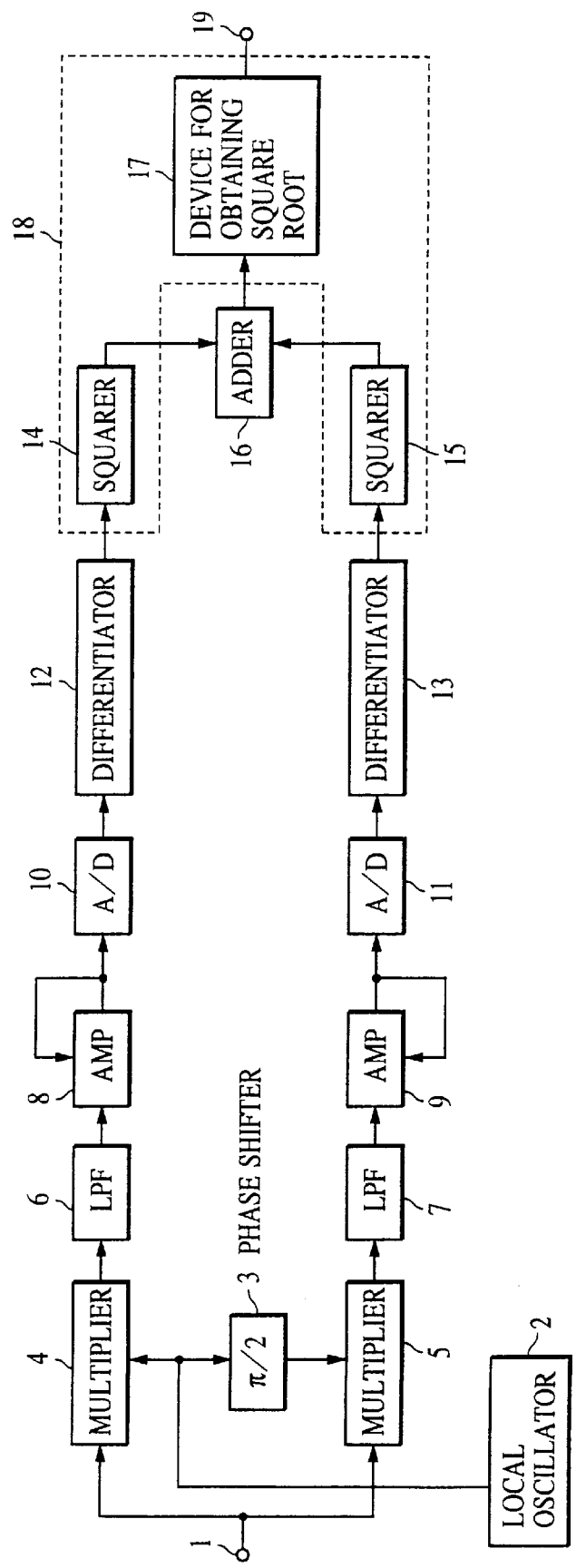
FIG. 1 is a block diagram showing a circuit system in an embodiment of the present invention.

In a mode of realization of the present invention the circuit construction is e.g. as indicated in FIG. 1. In short, in principle, it is sufficient that a circuit for realizing it may be so constructed that the two-axis components X and Y are differentiated, that the differentials thus obtained are added after having been squared respectively, and that a demodulated output is obtained by extracting a square root of a result of this addition. A working principle for this operation will be explained below.

Designating an angular frequency of a reference signal (output signal of a local oscillator) by $\omega_S$, an angular frequency of an FM signal with respect to the reference signal by $\Omega$, and phases thereof from an arbitrary reference by $\theta$ and $\phi$, an input FM signal g(t) and a local oscillation signal h(t) can be represented by Equation (6) and Equation (7), respectively.

$$g(t)=\cos\ (\omega_S t+\Omega t+\theta) \tag{6}$$

$$h(t)=\cos\ (\omega_S t+\phi) \tag{7}$$

The two-axis components x(t) and y(t) are represented by Equation (8) and Equation (9), respectively, neglecting amplitude coefficients.

$$x(t)=\cos\ (\Omega t+\theta-\phi) \tag{8}$$

$$y(t)=\sin\ (\Omega t+\theta-\phi) \tag{9}$$

Differentials x'(t) and y'(t) represented by Equation (10) and Equation (11) can be obtained by differentiating x(t) and y(t), respectively.

$$x'(t)=-\Omega\ \sin\ (\Omega t+\theta-\phi) \tag{10}$$

$$y'(t)=\Omega\ \cos\ (\Omega t+\theta-\phi) \tag{11}$$

Squaring them, $$x'^2(t)=\Omega^2\{1-\cos\ (2\Omega t+2\theta-2\phi)\} \tag{12}$$

$$y'^2(t)=\Omega^2\{1+\cos\ (2\Omega t+2\theta-2\phi)\} \tag{13}$$

can be obtained. The sum of these terms $x'^2(t)$ and $y'^2(t)$ is equal to $2\Omega^2$. Since the coefficient 2 is a gain coefficient, it is neglected similarly to the above described case, and a demodulation output can be obtained by obtaining $\Omega$ by extracting a square root of $\Omega^2$.

The operation of differentiation→squaring→addition is as indicated by Formula (14).

$$(X_K-X_{K-1})^2+(Y_K-Y_{K-1})^2 \tag{14}$$

The demodulation output D is a square root, which is given by Equation (15).

$$D=\sqrt{(X_K-X_{K-1})^2+(Y_K-Y_{K-1})^2} \tag{15}$$

For obtaining square roots there is known a method, wherein a square root algorism is used. Since this consists also of repeated calculations, it is easier to use an ROM, in which square roots are stored, similarly to squares.

As clearly seen from explanation of Equations (6) to (13), by the method according to the present invention, demodulation characteristics for higher and lower frequencies of the local oscillation signal $\omega_S$ serving as the reference are even-symmetric. Consequently the frequency of the local oscillation carrier should be set not at the center of the FM signal, but at a frequency close to the FM signal band on the outer side thereof.

The principle of the demodulation according to the present invention has been explained in the above. Therefore it is possible to demodulate an FM base band signal by direct conversion, if the circuit is constructed so as to effect operations according to this process.

Now embodiments of the present invention indicated in the figures will be explained.

FIG. 1 is a circuit construction diagram showing an embodiment of the frequency discriminator for a direct conversion receiver according to the present invention. In FIG. 1, reference numeral 1 is an input terminal of FM signals; 2 is a local carrier generator; 3 is a 90° phase shifter; 4 and 5 are multipliers; 6 and 7 are low pass filters (LPF); 8 and 9 are amplifiers (AMP) with AGC (Automatic Gain Control); 10 and 11 are analogue/digital (A/D) converters; 12 and 13 are differentiators; 14 and 15 are squarers; 16 is an adder; 17 is a device for extracting square root; 18 is an ROM (Read Only Memory); and 19 is a demodulation output terminal.

In FIG. 1, an FM signal applied to the signal input terminal 1 is multiplied by a local oscillation carrier and by a carrier having a phase differing therefrom by 90° through the phase shifter 3 by means of the multipliers 4 and 5, respectively. Two signal components, one of them being inphase, while the other of them is quadrature, whose frequencies are reduced to the base band with respect to the local oscillation carrier (corresponding to Equations (8) and (9)) can be obtained by making them pass through the low pass filters 6 and 7. These signal components are amplified to a, predetermined amplitude by means of the AMP 8 and 9 with AGC and converted into digital signals by means of the A/D converters 10 and 11, respectively.

Figure 2:
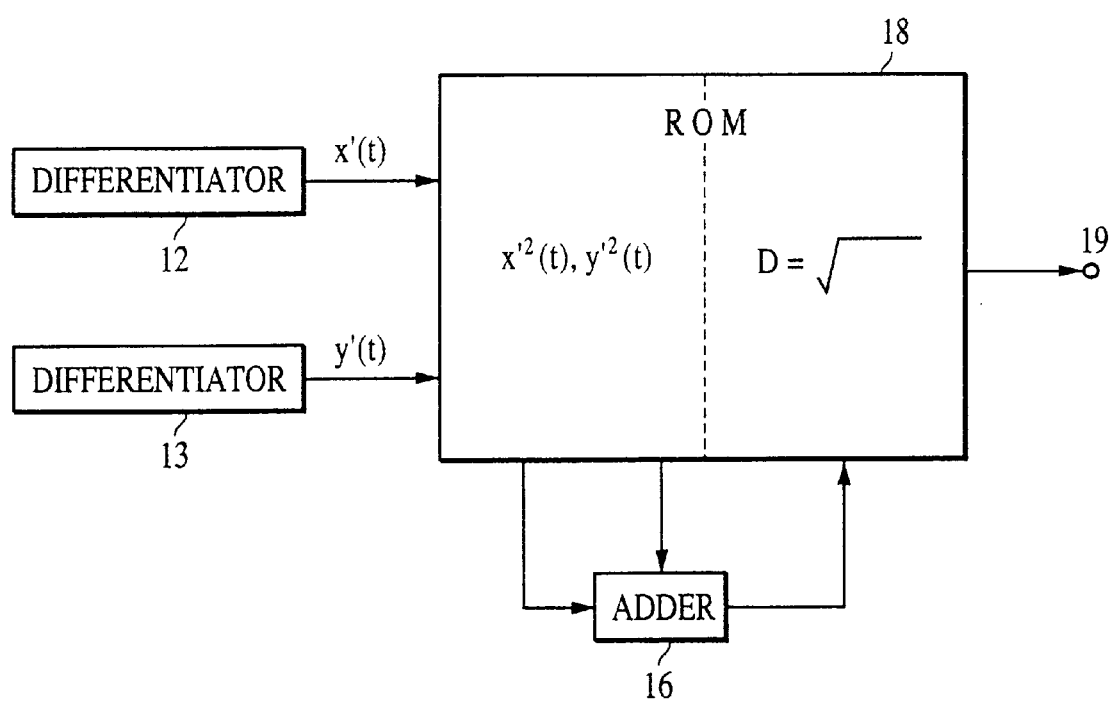
FIG. 2 is a block diagram showing a principal part of another embodiment of the present invention.

These digital signals are differentiated by means of the differentiators 12 and 13. Thus differential operation is a finite difference calculation, as it can be seen from Formula 14, and it can be carried out by means of circuits, each of which consists of a register and a subtractor. Outputs of the differentiators 12 and 13 are squared by means of the squares 14 and 15, the outputs of which are added to each other by means of the adder 16. This operation of differentiation→squaring→addition corresponds to Formula 14. A square root of the output of the adder 16 is extracted by the device for extracting square root 17 and the demodulation output by the operation given by Equation 15 is obtained at the output terminal 19. As explained previously, ROM can be used for these operations of squaring and extraction of square root and it is possible to bring them together in one ROM as indicated by a frame indicated by a broken line. That is, as indicated in FIG. 2, squares $x'^2(t)$ and $y'^2(t)$ given by Equations (12) and (13) as well as square roots D given by Equation (15) are stored in the ROM 18. Squares corresponding to the outputs of the differentiators 12 and 13 are read out from the ROM 18 to be added to each other by the adder 16.

As explained in detail in the above, contrarily to the fact that an operation according to Equation (5) was necessary by the prior art method, since according to the present invention it is simplified as indicated by Equation (15), the demodulation circuit is simplified and it is possible to realize easily an frequency discriminator for an FM receiver by direct conversion.

What is claimed is:

1. In a frequency discriminator for a direct conversion type FM receiver, comprising:

direct conversion means for converting an FM signal into an inphase signal component x and a quadrature signal component y in a base band;

analogue/digital converting means for converting both said signal components into digital signals;

differentiating means for obtaining differentials x', y' of said digital signals; and operating means for obtaining squares $x'^2$, $y'^2$ of said differentials x', y' to obtain a demodulated output of said FM signal by obtaining a sum of said squares and by obtaining a square root of said sum, the improvement wherein said operating means consists of an ROM and an adder and squares $x'^2$, $y'^2$ and square roots $$\sqrt{x'^2 + y'^2}$$

are stored in said ROM, and said ROM is connected to said differentiating means and said adder so that said squares $x'^2$, $y'^2$ from the ROM is added by said adder and said square roots $$\sqrt{x'^2 + y'^2}$$

corresponding to said sum $x'^2+y'^2$ from the adder is outputted from the ROM.

* * * * *